(12) United States Patent
Park et al.

(10) Patent No.: US 11,037,992 B2
(45) Date of Patent: Jun. 15, 2021

(54) VARIABLE RESISTANCE MEMORY DEVICE

(71) Applicant: SAMSUNG ELECTRONICS CO., LTD., Suwon-si (KR)

(72) Inventors: Jeonghee Park, Hwaseong-si (KR); Dongho Ahn, Hwaseong-si (KR); Changyup Park, Hwaseong-si (KR); Zhe Wu, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/567,094

(22) Filed: Sep. 11, 2019

(65) Prior Publication Data
US 2020/0227475 A1    Jul. 16, 2020

(30) Foreign Application Priority Data

Jan. 11, 2019   (KR) .................. 10-2019-0003839

(51) Int. Cl.
*H01L 45/00*    (2006.01)
*H01L 27/24*    (2006.01)

(52) U.S. Cl.
CPC ........ *H01L 27/249* (2013.01); *H01L 27/2409* (2013.01); *H01L 45/06* (2013.01); *H01L 45/144* (2013.01); *H01L 45/1683* (2013.01)

(58) Field of Classification Search
CPC ..... H01L 45/06; H01L 45/065; H01L 45/141; H01L 45/1226
See application file for complete search history.

(56) References Cited

U.S. PATENT DOCUMENTS

| | | | |
|---|---|---|---|
| 8,547,720 B2 | 10/2013 | Samachisa et al. | |
| 8,824,183 B2 | 9/2014 | Samachisa et al. | |
| 9,293,700 B2 | 3/2016 | Ju et al. | |
| 9,634,246 B2 | 4/2017 | Lee | |
| 9,768,234 B2 | 9/2017 | Jo | |
| 9,876,055 B1* | 1/2018 | Chen | H01L 45/1683 |
| 10,262,730 B1* | 4/2019 | Nardi | G11C 13/0004 |
| 10,381,409 B1* | 8/2019 | Zhou | H01L 45/143 |
| 10,381,559 B1* | 8/2019 | Zhou | H01L 27/2436 |
| 2015/0340406 A1* | 11/2015 | Jo | H01L 45/122 29/604 |
| 2016/0180929 A1* | 6/2016 | Kang | G11C 11/1659 365/63 |

(Continued)

*Primary Examiner* — George R Fourson, III
(74) *Attorney, Agent, or Firm* — Lee IP Law, P.C.

(57) ABSTRACT

A variable resistance memory device including insulating patterns sequentially stacked on a substrate; first conductive lines between adjacent ones of the insulating patterns and spaced apart from each other in a first direction; a second conductive line between the first conductive lines and penetrating the insulating patterns in a third direction perpendicular to a top surface of the substrate; a phase-change pattern between the second conductive line and each of the first conductive lines and between the adjacent ones of the insulating patterns to cover a top surface of a first adjacent insulating pattern and a bottom surface of a second adjacent insulating pattern; and a selection element between the phase-change pattern and the second conductive line and between the adjacent ones of the insulating patterns to cover the top surface of the first adjacent insulating pattern and the bottom surface of the second adjacent insulating pattern.

20 Claims, 16 Drawing Sheets

(56) References Cited

U.S. PATENT DOCUMENTS

| | | |
|---|---|---|
| 2016/0293665 A1 | 10/2016 | Toh et al. |
| 2017/0358626 A1 | 12/2017 | Franca-Neto et al. |
| 2018/0138242 A1 | 5/2018 | Sciarrillo |
| 2018/0159030 A1* | 6/2018 | Park .................... H01L 45/1233 |
| 2018/0204880 A1 | 7/2018 | Fantini |
| 2018/0211703 A1 | 7/2018 | Choi et al. |
| 2018/0219153 A1 | 8/2018 | Hopkins |
| 2020/0075850 A1* | 3/2020 | Park .................... H01L 45/1616 |
| 2020/0194670 A1* | 6/2020 | Allegro ................ H01L 45/141 |
| 2020/0203361 A1* | 6/2020 | Kang ................ H01L 27/11575 |
| 2020/0227475 A1* | 7/2020 | Park ........................ H01L 45/06 |

* cited by examiner

VARIABLE RESISTANCE MEMORY DEVICE

CROSS-REFERENCE TO RELATED APPLICATION

Korean Patent Application No. 10-2019-0003839, filed on Jan. 11, 2019, in the Korean Intellectual Property Office, and entitled: "Variable Resistance Memory Device," is incorporated by reference herein in its entirety.

BACKGROUND

1. Field

Embodiments relate to a variable resistance memory device.

2. Description of the Related Art

Higher integration of semiconductor devices may help satisfy consumer demands for superior performance and inexpensive prices. In the case of semiconductor devices, their integration may be an important factor in determining product prices, and increased integration may be desirable.

SUMMARY

The embodiments may be realized by providing a variable resistance memory device including insulating patterns sequentially stacked on a substrate; first conductive lines between adjacent ones of the insulating patterns and spaced apart from each other in a first direction; a second conductive line between the first conductive lines and penetrating the insulating patterns in a third direction perpendicular to a top surface of the substrate; a phase-change pattern between the second conductive line and each of the first conductive lines and between the adjacent ones of the insulating patterns to cover a top surface of a first adjacent insulating pattern and a bottom surface of a second adjacent insulating pattern; and a selection element between the phase-change pattern and the second conductive line and between the adjacent ones of the insulating patterns to cover the top surface of the first adjacent insulating pattern and the bottom surface of the second adjacent insulating pattern.

The embodiments may be realized by providing a variable resistance memory device including insulating patterns sequentially stacked on a substrate in a third direction perpendicular to a top surface of the substrate; first conductive lines between adjacent ones of the insulating patterns in the third direction and spaced apart from each other in a first direction; a second conductive line between the first conductive lines and penetrating the insulating patterns in the third direction; a selection element between the second conductive line and each of the first conductive lines and between the adjacent ones of the insulating patterns, the selection element having a first recess portion recessed inwardly from a side surface thereof; and a capping pattern in the first recess portion.

The embodiments may be realized by providing a variable resistance memory device including first conductive lines stacked in a third direction perpendicular to a top surface of a substrate and extending lengthwise in a first direction; at least one second conductive line at one side of the first conductive lines and extending lengthwise in the third direction; and a memory cell including a phase-change pattern and a selection element between each of the first conductive lines and the at least one second conductive line, wherein the selection element includes an oxide diode or a transition metal oxide.

BRIEF DESCRIPTION OF THE DRAWINGS

Features will be apparent to those of skill in the art by describing in detail exemplary embodiments with reference to the attached drawings in which:

FIGS. 6A to 9A illustrate plan views of stages in a method of fabricating a variable resistance memory device according to an embodiment.

FIGS. 6B to 9B illustrate sectional views, which are taken along lines I-I' of FIGS. 6A to 9A, of stages in a method of fabricating a variable resistance memory device according to an embodiment.

DETAILED DESCRIPTION

Figure 1A:
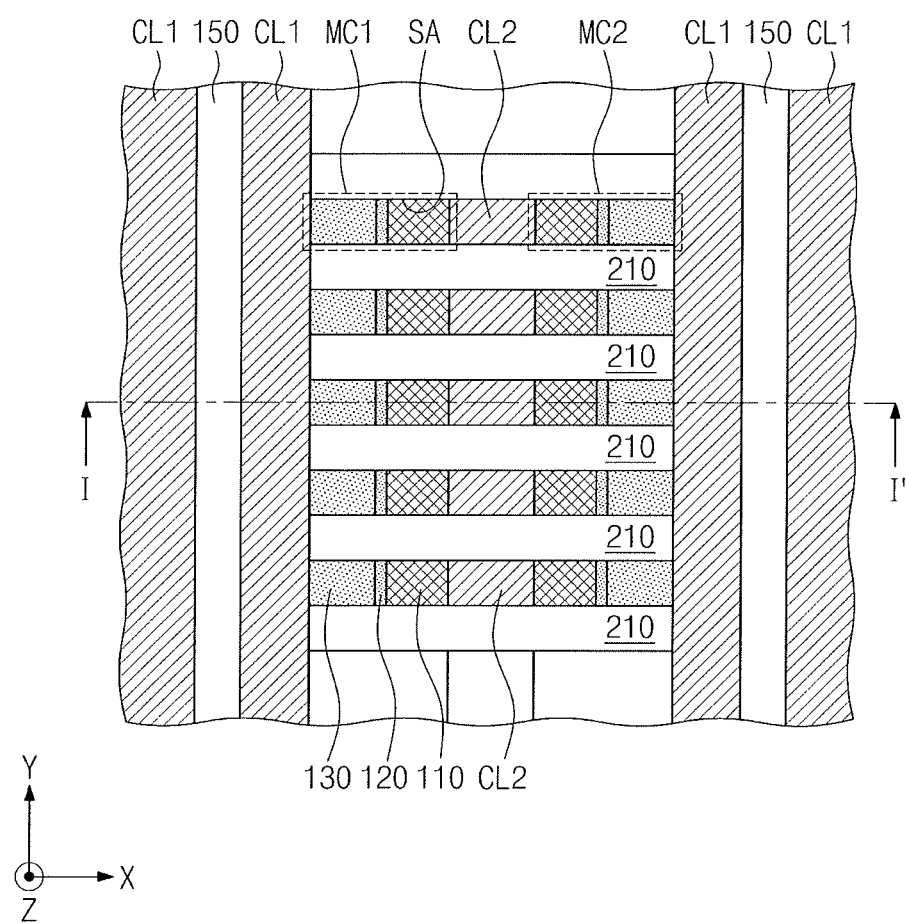
FIG. 1A illustrates a plan view of a variable resistance memory device according to an embodiment.
Figure 1B:
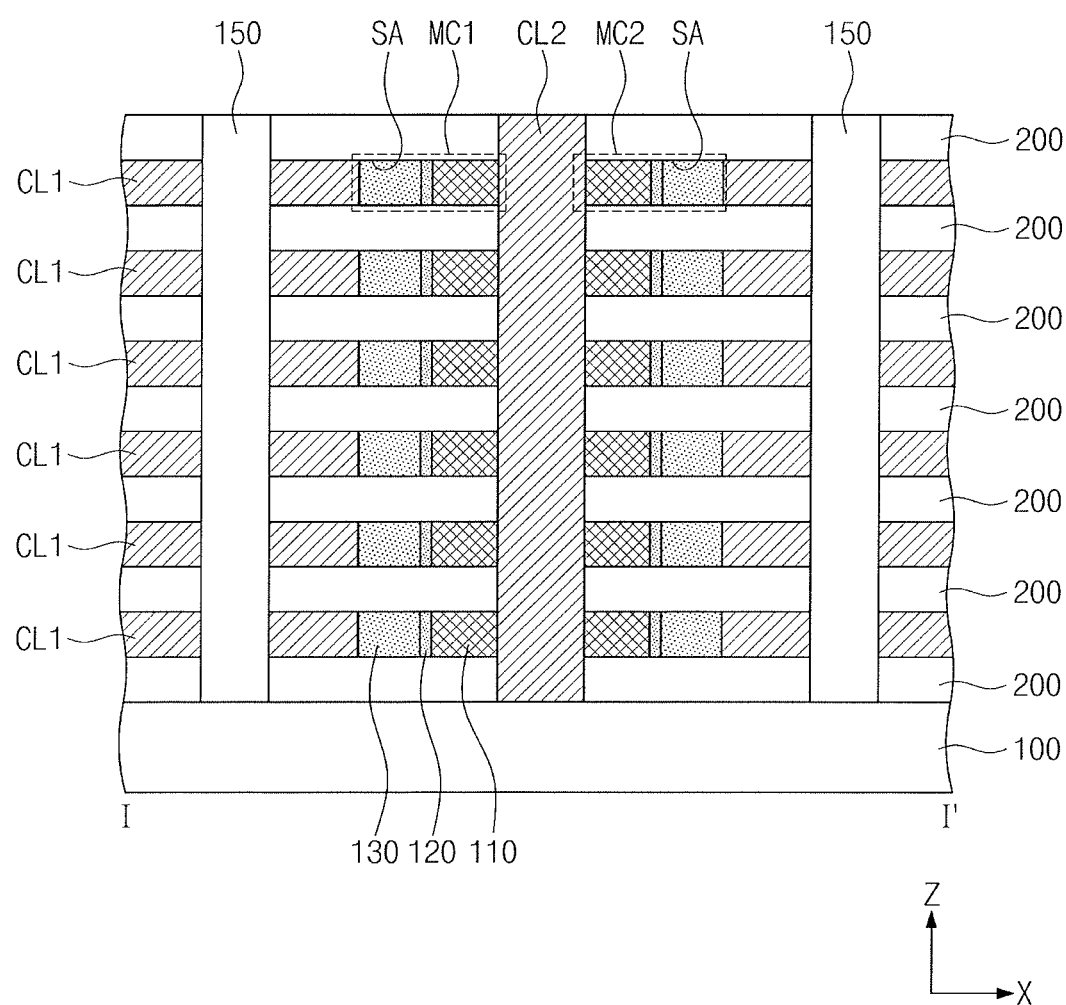
FIG. 1B illustrates a sectional view taken along a line I-I' of FIG. 1A of a variable resistance memory device according to an embodiment.

FIG. 1A illustrates a plan view of a variable resistance memory device according to an embodiment. FIG. 1B illustrates a sectional view taken along a line I-I' of FIG. 1A of a variable resistance memory device according to an embodiment.

Referring to FIGS. 1A and 1B, insulating patterns 200 may be sequentially stacked on a substrate 100. For example, the insulating patterns 200 may be spaced apart from each other, in a third direction Z (perpendicular to a top surface of the substrate 100) on the substrate 100. A lowermost one of the insulating patterns 200 may be in contact, e.g., direct contact, with the top surface of the substrate 100. The insulating patterns 200 may include, e.g., a silicon nitride layer. The substrate 100 may be, e.g., a semiconductor substrate (e.g., of silicon, germanium, or silicon/germanium), a silicon-on-insulator (SOI) substrate, or a germanium-on-insulator (GOI) substrate. Buried insulating patterns 210 may be on the substrate 100. The buried insulating patterns buried insulating patterns 210 may be on the top surface of the substrate 100 and may penetrate the insulating patterns 200. The buried insulating patterns 210 may extend lengthwise in a first direction X and may be spaced apart from each other in a second direction Y crossing the first direction X. The buried insulating patterns 210 may be formed of or include, e.g., an oxide, a nitride, or an oxynitride. As used herein, the term "or" is not an exclusive term, and includes any and all combinations of the listed choices.

First conductive lines CL1 may be at both sides of the buried insulating patterns 210. For example, when viewed in a plan view, e.g., as seen in FIG. 1A, the buried insulating patterns 210 may be between a pair of the first conductive lines CL1. Each of the first conductive lines CL1 may extend lengthwise in the second direction Y, between the insulating patterns 200 that are adjacent to each other in the third direction Z. The first conductive lines CL1 may be stacked in the third direction Z and may be between the insulating patterns 200. The first conductive lines CL1 may cover or contact, e.g., directly contact, top surfaces (e.g., surfaces facing away from the substrate 100) and bottom surfaces (e.g., surfaces facing toward the substrate 100) of the insulating patterns 200 and side surfaces of the buried insulating patterns 210. In an implementation, the first conductive lines CL1 may be word lines. The first conductive lines CL1 may be formed of or include, e.g., a metal (such as tungsten, copper, or aluminum).

Second conductive lines CL2 may be between the buried insulating patterns 210. The second conductive lines CL2 may be on the top surface of the substrate 100 and penetrate the insulating patterns 200 that are between the buried insulating patterns 210. The second conductive lines CL2 may cover or contact, e.g., directly contact, the top surface of the substrate 100. The second conductive lines CL2, which may be arranged in the second direction Y, may be spaced apart from each other (e.g., in the second direction Y) with the buried insulating patterns 210 therebetween. The second conductive lines CL2 may be formed of or include, e.g., a metal (such as copper, tungsten, or aluminum) or a metal nitride (such as tantalum nitride, titanium nitride, or tungsten nitride).

Memory cells MC1 and MC2 may be between the first conductive lines CL1 and the second conductive lines CL2. The memory cells MC1 and MC2 may be between insulating patterns 200 that are adjacent to each other in the third direction Z. For example, the memory cells MC1 and MC2 may be in spaces SA, which are defined between buried insulating patterns 210 (that are adjacent to each other in the second direction Y) and between insulating patterns 200 (that are adjacent to each other in the third direction Z). The memory cells MC1 and MC2 may include first memory cells MC1 and second memory cells MC2. The first memory cells MC1 may be on or at one side of the second conductive lines CL2, and the second memory cells MC2 may be on or at another side of the second conductive lines CL2. For example, the other side of the second conductive lines CL2 may be opposite to the one side of the second conductive lines CL2 (along the first direction X). The first memory cells MC1 and the second memory cells MC2 may be spaced apart from each other in the first direction X, with the second conductive lines CL2 therebetween. For example, each of the second conductive lines CL2 may be between a pair (or more than one pair) of the first and second memory cells MC1 and MC2.

When viewed in a plan view, e.g., as seen in FIG. 1A, the memory cells MC1 and MC2 arranged in the second direction Y may be spaced apart from each other (e.g., in the second direction Y), with the buried insulating patterns 210 therebetween. For example, the first memory cells MC1 may be arranged in the second direction Y, with the buried insulating patterns 210 therebetween, and the second memory cells MC2 may be arranged in the second direction Y, with the buried insulating patterns 210 therebetween. The memory cells MC1 and MC2 may be respectively spaced apart from each other in the third direction Z, with the insulating patterns 200 therebetween. In an implementation, pairs of the first and second memory cells MC1 and MC2, which pairs are spaced apart from each other in the first direction X, may be connected in common to a corresponding one the second conductive lines CL2 therebetween. In an implementation, respective ones of the first and second memory cells MC1 and MC2, which are at the same level (e.g., the same distance from the substrate 100) and are spaced apart from each other in the second direction Y, may be connected in common to a corresponding one of the first conductive lines CL1. For example, the first memory cells MC1 that are at the same level may be connected in common to one of the first conductive lines CL1, and the second memory cells MC2 that are at the same level may be connected in common to another one of the first conductive lines CL1.

Each of the memory cells MC1 and MC2 may include a selection element 110, a barrier pattern 120, and a phase-change pattern 130. The selection element 110 may be between each of the first conductive lines CL1 and each of the second conductive lines CL2. The barrier pattern 120 may be between the first conductive line CL1 and the selection element 110. The phase-change pattern 130 may be between the first conductive line CL1 and the barrier pattern 120. The selection element 110 may be adjacent to the second conductive line CL2. For example, the selection element 110 may be in contact, e.g., direct contact, with at least a portion of a side surface of the second conductive line CL2. The selection element 110 may cover or contact, e.g., directly contact, at least a portion of an inner surface of each space SA (e.g., the top and bottom surfaces of the insulating patterns 200 adjacent to each other in the third direction Z and the side surfaces of the buried insulating patterns 210 adjacent to each other in the second direction Y). The selection element 110 may be a current control device, which may control a current flow passing through each of the memory cells MC1 and MC2.

In an implementation, the selection element 110 may include an ovonic threshold switching (OTS) material. For example, the selection element 110 may include a chalcogenide switching material as the OTS material. The selection element 110 may include a chalcogenide switching material containing, e.g., arsenic (As) and selenium (Se) and may further include an additive element. The additive element may include, e.g., boron (B), carbon (C), nitrogen (N), oxygen (O), phosphorus (P), or sulfur (S). In an implementation, the selection element 110 may include, e.g., GeSe, AsGeSe, GeAsSeTe, GeAsTe, SiAsGeSe, or SiAsGeTe. In an implementation, the selection element 110 may include, e.g., an oxide diode. The oxide diode may include, e.g., an n-type oxide layer and a p-type oxide layer. In an implementation, the n-type oxide layer may include, e.g., indium zinc oxide, indium tin oxide, zinc oxide, tin oxide, or titanium oxide. In an implementation, the p-type oxide layer may include, e.g., copper oxide, nickel oxide, copper aluminum oxide, zinc rhodium oxide, or strontium copper oxide. In an implementation, the selection element 110 may include, e.g., a transition metal oxide. In an implementation, the selection element 110 may include, e.g., NiO, ZnO, TiO, HfO, or TaO.

The phase-change pattern 130 may be between the first conductive line and the selection element 110. The phase-change pattern 130 may be adjacent to the first conductive line CL1. For example, the phase-change pattern 130 may cover or contact, e.g., directly contact, at least a portion of a side surface of the first conductive line CL1. The phase-change pattern 130 may cover or contact, e.g., directly contact, at least a portion of the inner surface of each space SA (e.g., the top and bottom surfaces of the insulating patterns 200 adjacent to each other in the third direction Z and the side surfaces of the buried insulating patterns 210 adjacent to each other in the second direction Y). The phase-change pattern 130 may include a material, whose resistance can be changed depending on its phase or crystal structure, and the phase-change pattern 130 may be used as a memory element. The phase-change pattern 130 may include a phase-changeable material, whose crystalline structure can be reversibly switched to one of crystalline and amorphous structures depending on its temperature. The phase-change pattern 130 may include, e.g., a chalcogenide material, whose chemical composition is different from that of a chalcogenide switching material included in the selection element 110. In an implementation, the phase-change pattern 130 may include, e.g., a tellurium-containing chalcogenide material, in which arsenic (As) and selenium (Se) are not contained. The phase-change pattern 130 may include impurities. In an implementation, the impurities may be carbon (C), nitrogen (N), or silicon (Si). In an implementation, the phase-change pattern 130 may include, e.g., GeSbTe, GeTe, SbTe, GeBiTe, GeTeTi, or SnSbTe.

The barrier pattern 120 may be between the selection element 110 and the phase-change pattern 130. The barrier pattern 120 may help prevent a metal diffusion issue between the phase-change pattern 130 and the selection element 110 and may help reduce a contact resistance between the phase-change pattern 130 and the selection element 110. The barrier pattern 120 may include, e.g., carbon, TiN, TiSiN, $WSi_x$, or WN.

Insulating separation patterns 150 may extend in the third direction Z, on or from the top surface of the substrate 100. The insulating separation patterns 150 may be in contact, e.g., direct contact, with the top surface of the substrate 100. The insulating separation patterns 150 may penetrate the first conductive lines CL1 and the insulating patterns 200. When viewed in a plan view, e.g., as in FIG. 1A, the insulating separation patterns 150 may be at both sides of the buried insulating patterns 210 and may extend in the second direction Y. The insulating separation patterns 150 may extend along side surfaces of the first conductive lines CL1 and may be between first conductive lines CL1 that are adjacent to each other in the first direction X.

Figure 2A:
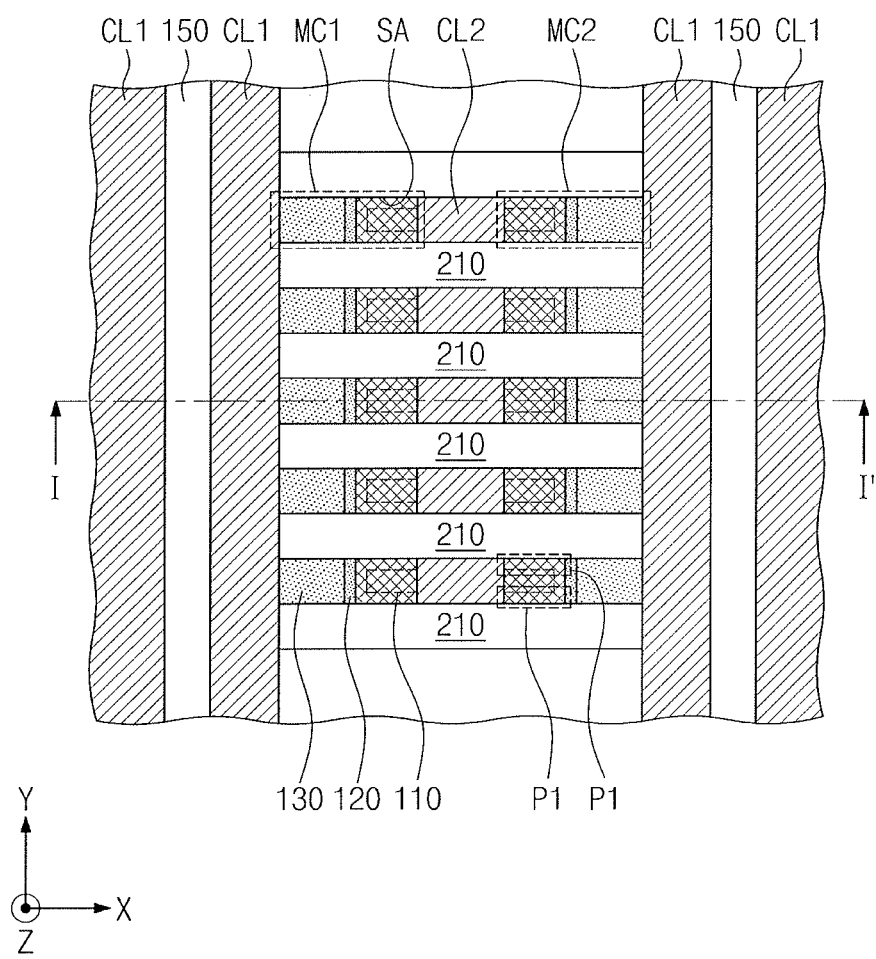
FIG. 2A illustrates a plan view of a variable resistance memory device according to an embodiment.
Figure 2B:
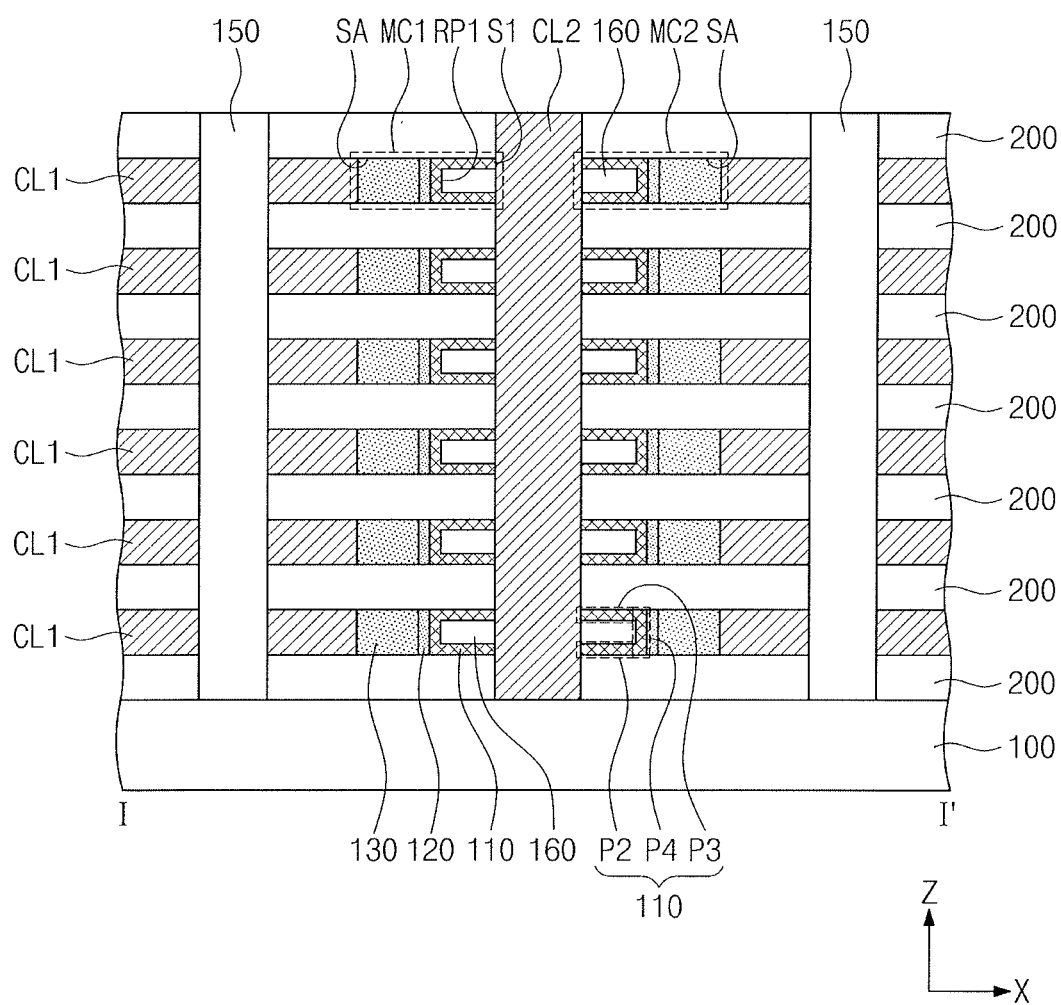
FIG. 2B illustrates a sectional view taken along a line I-I' of FIG. 2A of a variable resistance memory device according to an embodiment.
Figure 2C:
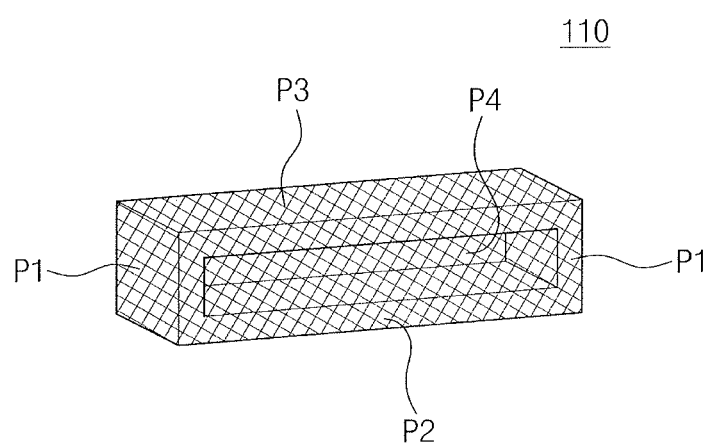
FIG. 2C illustrates a perspective view of a selection element.

FIG. 2A illustrates a plan view of a variable resistance memory device according to an embodiment. FIG. 2B illustrates a sectional view taken along a line I-I' of FIG. 2A of a variable resistance memory device according to an embodiment. FIG. 2C illustrates a perspective view illustrating a selection element.

Referring to FIGS. 2A, 2B, and 2C, the selection element 110 may have a first recess portion RP1, which is recessed inwardly from a side surface S1 of the selection element 110 that is adjacent to the second conductive line CL2. The first recess portion RP1 may be enclosed by the selection element 110 and the second conductive line CL2. The selection element 110 may include first portions P1, a second portion P2, a third portion P3, and a fourth portion P4. The first portions P1 may cover or contact, e.g., directly contact, the side surfaces of a pair of the buried insulating patterns 210, which are exposed by each of the spaces SA and are adjacent to each other in the second direction Y. The first portions P1 may be parallel to each other. The second portion P2, the third portion P3, and the fourth portion P4 may be between the first portions P1. For example, the second portion P2 may cover or contact, e.g., directly contact, a top surface of a lower insulating pattern of the insulating patterns 200 adjacent to each other in the third direction Z. The third portion P3 may cover or contact, e.g., directly contact, a bottom surface of an upper insulating pattern of the insulating patterns 200 adjacent to each other in the third direction Z. The top surface of the lower insulating pattern and the bottom surface of the upper insulating pattern, which are adjacent to each other in the third direction Z, may be exposed by each of the spaces SA. The second portion P2 and the third portion P3 may be parallel to the first direction X, may extend lengthwise in the second direction Y, and may be connected to the first portions P1. The fourth portion P4 may cover or contact, e.g., directly contact, a side surface of the barrier pattern 120. The fourth portion P4 may be connected to the second and third portions P2 and P3. The fourth portion P4 may extend lengthwise in the second direction Y and may be connected to the first portions P1.

A capping pattern 160 may be in the first recess portion RP1 of the selection element 110. A side surface of the capping pattern 160 may be aligned to, e.g., coplanar with, the side surface S1 of the selection element 110. In an implementation, the capping pattern 160 may be formed of or include, e.g., silicon oxide or silicon nitride.

Figure 3A:
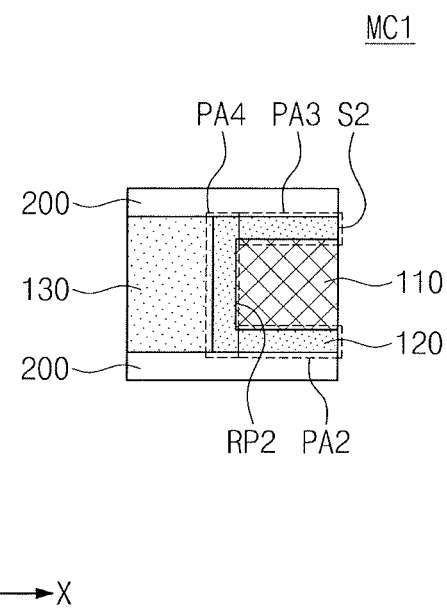
FIGS. 3A and 3B illustrate enlarged sectional views of memory cells according to an embodiment.
Figure 3B:
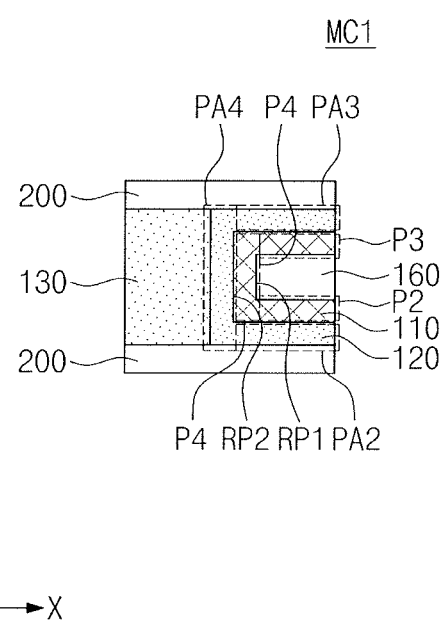

FIGS. 3A and 3B illustrate enlarged sectional views of memory cells according to an embodiment.

Referring to FIGS. 3A and 3B, the barrier pattern 120 may have a second recess portion RP2, which is recessed inwardly from a side surface S2 thereof that is adjacent to the second conductive line CL2. The barrier pattern 120 may include first portions, a second portion PA2, a third portion PA3, and a fourth portion PA4. The first portions may cover or contact, e.g., directly contact, side surfaces of the buried insulating patterns 210. The second portion PA2 may cover or contact, e.g., directly contact, a top surface of a lower one of the insulating patterns 200 adjacent to the barrier pattern 120 in the third direction Z. The third portion PA3 may cover or contact, e.g., directly contact, a bottom surface of an upper one of the insulating patterns 200 adjacent to the barrier pattern 120 in the third direction Z. The second portion PA2 and the third portion PA3 may be parallel to the first direction X, may extend lengthwise in the second direction Y, and may be connected to the first portions. The fourth portion PA4 may cover or contact, e.g., directly contact, a side surface of the phase-change pattern 130. The fourth portion P4 may be connected to the first portions and the second and third portions P2 and P3. The second and third portions P2 and P3 of the barrier pattern 120 may have an insulating property, and the fourth portion P4 of the barrier pattern 120 may have a conductive property. The barrier pattern 120 may include, e.g., $TiO_2$.

In an implementation, as shown in FIG. 3A, the selection element 110 may be in the second recess portion RP2 of the barrier pattern 120. The selection element 110 may completely fill the second recess portion RP2. For example, the selection element 110 may not have the first recess portion RP1.

In an implementation, as shown in FIG. 3B, the selection element 110 may be in the second recess portion RP2 of the barrier pattern 120. The selection element 110 may have the first recess portion RP1. The first portions P1 (e.g., see FIG. 2C) of the selection element 110 may cover or contact, e.g., directly contact, the first portions of the barrier pattern 120, and the second portion P2 of the selection element 110 may cover or contact, e.g., directly contact, the second portion PA2 of the barrier pattern 120. The third portion P3 of the selection element 110 may cover or contact, e.g., directly contact, the third portion PA3 of the barrier pattern 120, and the fourth portion P4 of the selection element 110 may cover or contact, e.g., directly contact, the fourth portion PA4 of the barrier pattern 120. The capping pattern 160 may be in the first recess portion RP1 of the selection element 110.

Figure 4:
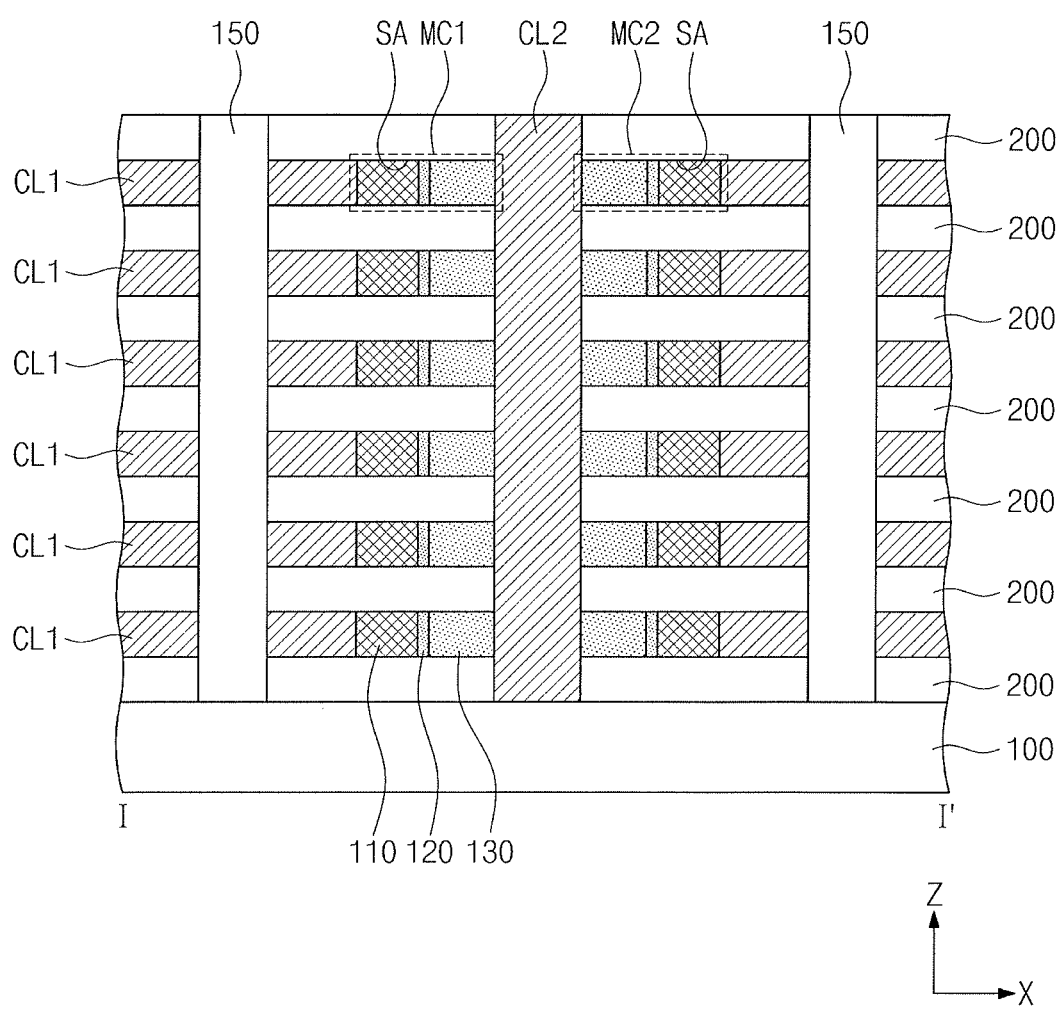
FIG. 4 illustrates a sectional view of a variable resistance memory device according to an embodiment.

FIG. 4 illustrates a sectional view of a variable resistance memory device according to an embodiment.

Referring to FIG. 4, each of the memory cells MC1 and MC2 may include the selection element 110, the barrier pattern 120, and the phase-change pattern 130. The selection element 110 may be between the first conductive lines CL1 and the second conductive lines CL2. The selection element 110 may be adjacent to the first conductive line CL1. The phase-change pattern 130 may be between the selection element 110 and the second conductive line CL2. The phase-change pattern 130 may be adjacent to the second conductive line CL2. The barrier pattern 120 may be between the selection element 110 and the second conductive line CL2.

Figure 5:
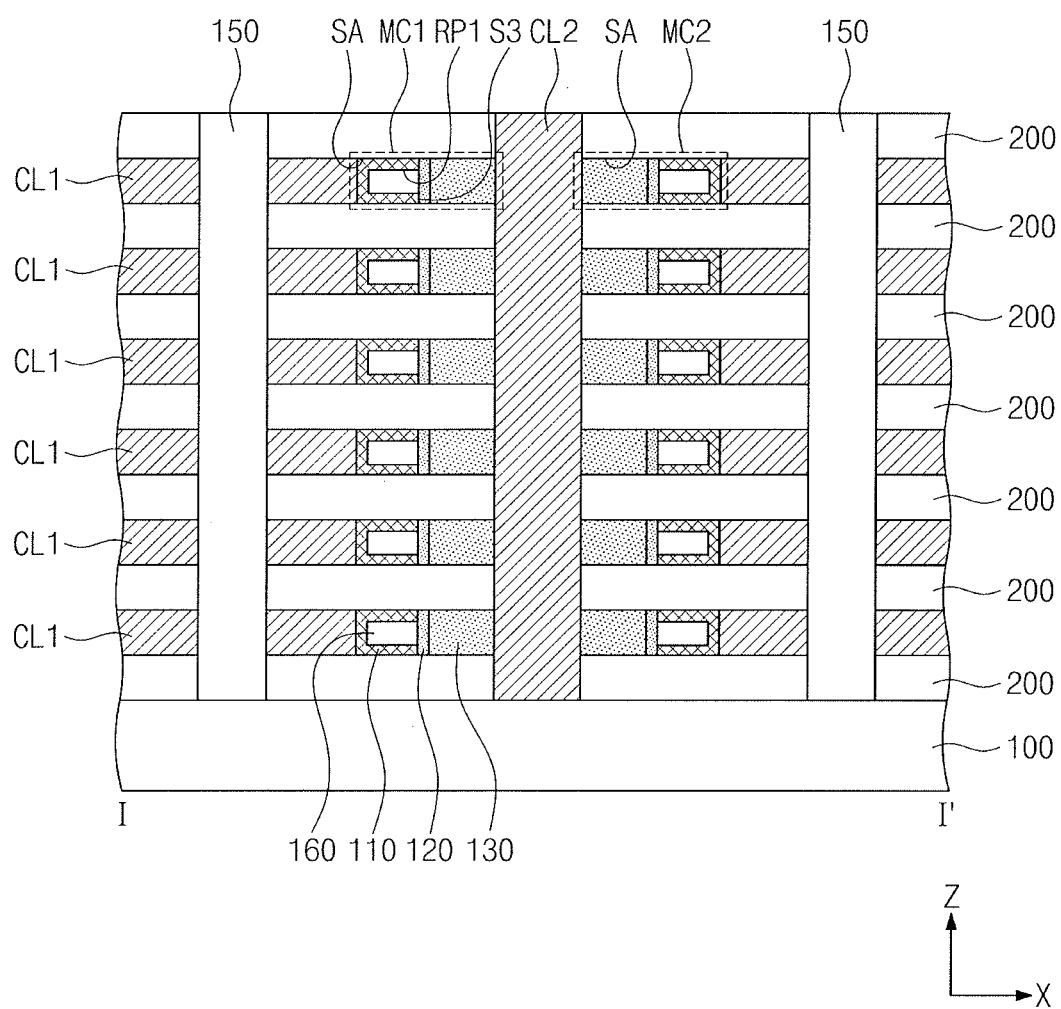
FIG. 5 illustrates a sectional view taken along a line I-I' of FIG. 4 of a variable resistance memory device according to an embodiment.

FIG. 5 illustrates a sectional view taken along a line I-I' of FIG. 4 of a variable resistance memory device according to an embodiment.

Referring to FIG. 5, the selection element 110 may have a first recess portion RP1, which is recessed inwardly from a side surface S3 thereof that is adjacent to the barrier pattern 120. The first recess portion RP1 may be enclosed by the selection element 110 and the barrier pattern 120. The structure of the selection element 110 may be substantially the same as that of the selection element 110 shown in FIG. 2C, and thus, a repeated detailed description thereof may be omitted. The capping pattern 160 may be in the first recess portion RP1.

FIGS. 6A to 9A illustrate plan views of stages in a method of fabricating a variable resistance memory device according to an embodiment. FIGS. 6B to 9B illustrate sectional views, which are taken along lines I-I' of FIGS. 6A to 9A, of stages in a method of fabricating a variable resistance memory device according to an embodiment.

Figure 6A:
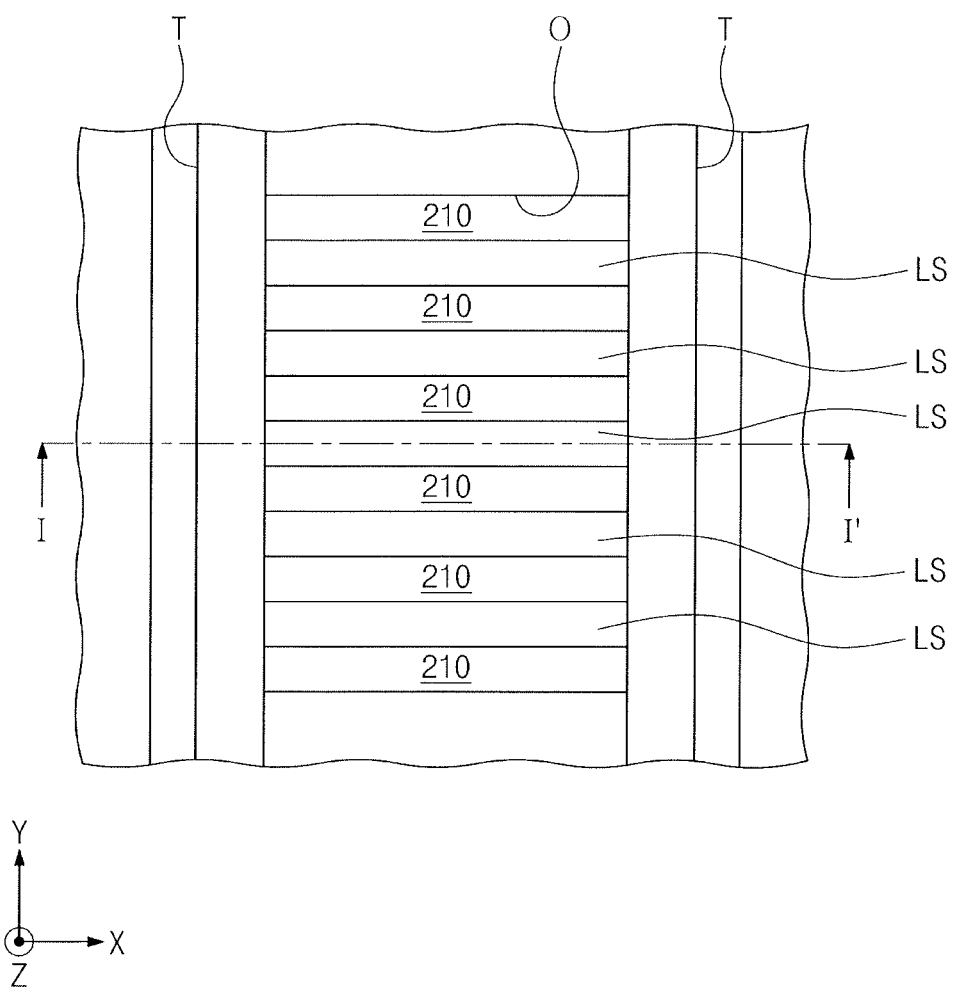
Figure 6B:
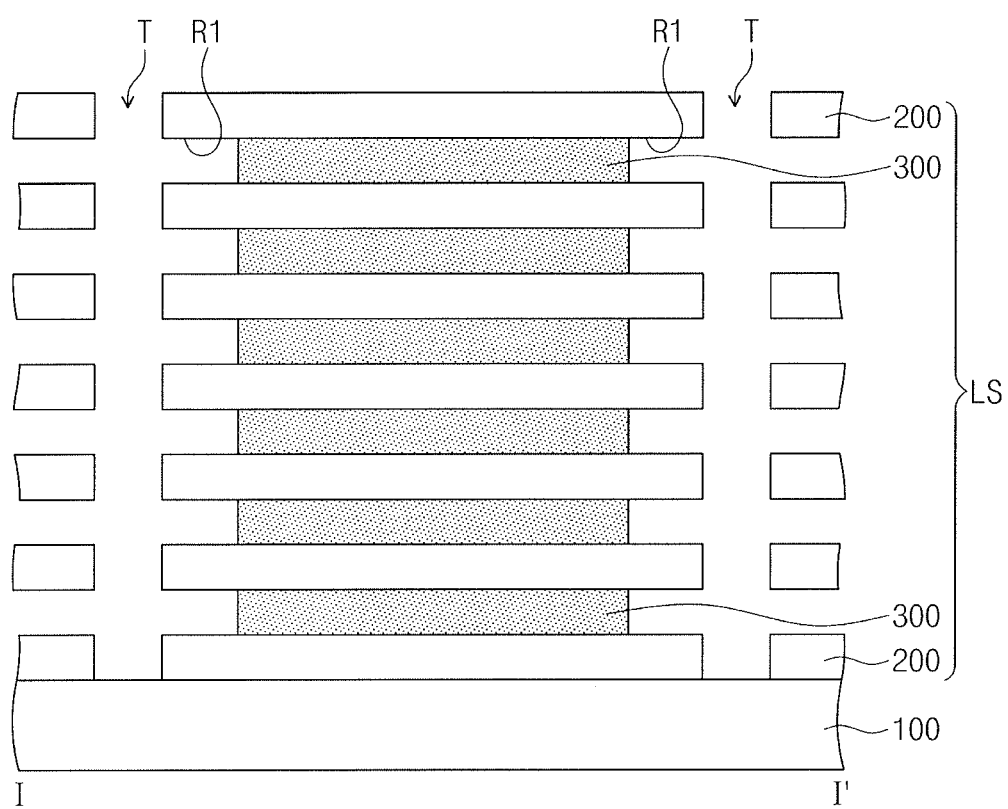

Referring to FIGS. 6A and 6B, a layer structure LS may be formed on the substrate 100. The layer structure LS may include the insulating patterns 200 and sacrificial patterns 300. The insulating patterns 200 and the sacrificial patterns 300 may be alternately stacked on the substrate 100. A lowermost one of the insulating patterns 200 may be a lowermost pattern of the layer structure LS, and an uppermost one of the insulating patterns 200 may be a uppermost pattern of the layer structure LS. The insulating patterns 200 may be formed of or include, e.g., silicon nitride. In an implementation, the sacrificial patterns 300 may include a chalcogenide material. In an implementation, the sacrificial patterns 300 may include, e.g., a tellurium-containing chalcogenide material, in which arsenic (As) and selenium (Se) are not contained. The phase-change pattern 130 may include impurities. In an implementation, the impurities may be, e.g., carbon (C), nitrogen (N), or silicon (Si). In an implementation, the sacrificial patterns 300 may include, e.g., GeSbTe, GeTe, SbTe, GeBiTe, GeTeTi, or SnSbTe. In an implementation, the sacrificial patterns 300 may be formed using, e.g., a chemical vapor deposition (PVD) method, an atomic layer deposition (ALD) method, or the like.

The buried insulating patterns 210 may be formed in the layer structure LS. The formation of the buried insulating patterns 210 may include etching the layer structure LS to form openings O, filling the openings O with an insulating material, and performing a planarization process to expose the top surface of the layer structure LS. The buried insulating patterns 210 may be spaced apart from each other in the second direction Y and may have a longitudinal axis, which is parallel to the first direction X crossing the second direction Y. The buried insulating patterns 210 may be formed of or include, e.g., an oxide, a nitride, or an oxynitride.

The sacrificial patterns 300 (exposed by trenches T) may be laterally etched such that side surfaces of the sacrificial patterns 300 are recessed. As a result, first recess regions R1 may be formed between the insulating patterns 200 that are adjacent to each other in the third direction Z. The first recess regions R1 may be formed, and the sacrificial patterns 300, which are located between the trenches T adjacent to each other in the first direction X, may have a reduced width in the first direction X. In an implementation, the trenches T may expose the side surfaces of the buried insulating patterns 210 parallel to the second direction Y. The trenches T may expose the side surfaces of the insulating patterns 200, and the first recess regions R1 may expose the top and bottom surfaces of the insulating patterns 200 and the side surfaces of the sacrificial patterns 300. In an implementation, as a result of the formation of the first recess regions R1, each of the layer structures LS may be between the buried insulating patterns 210 that are adjacent to each other in the second direction Y. The layer structures LS may be spaced apart from each other in the second direction Y.

Figure 7A:
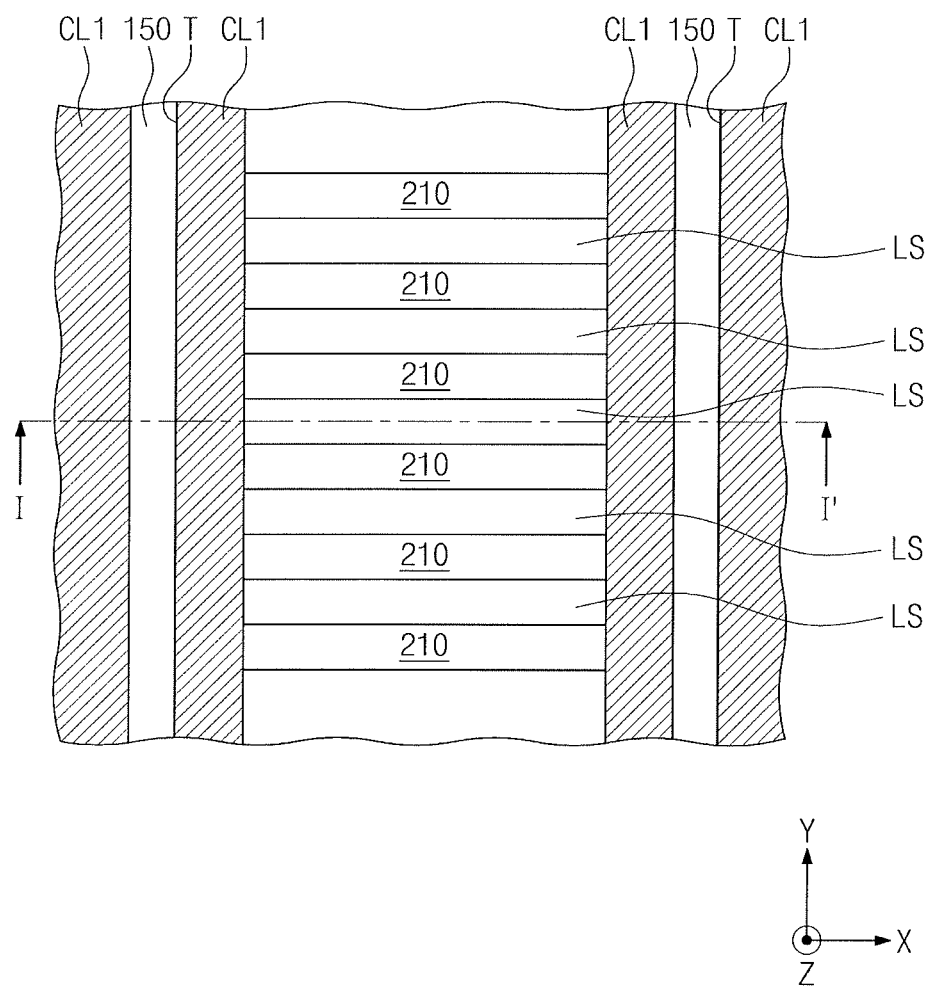
Figure 7B:
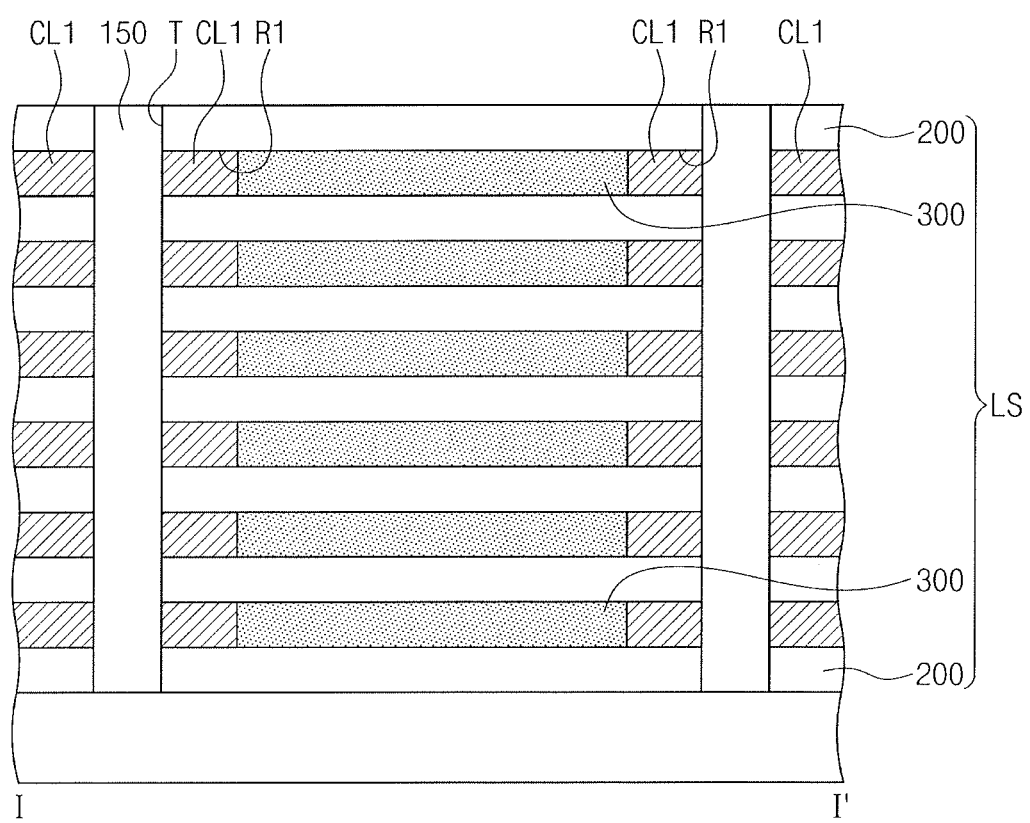

Referring to FIGS. 7A and 7B, the first conductive lines CL1 may be formed in the first recess regions R1. In an implementation, the formation of the first conductive lines CL1 may include forming a conductive layer to fill the first recess regions R1 and the trenches T and removing the conductive layer from the trenches T to expose the top surface of the substrate 100. In an implementation, the first conductive lines CL1 may be locally formed in the first recess regions R1. The first conductive lines CL1 may extend in the second direction Y. The first conductive lines CL1 may be in contact, e.g., direct contact, with the side surfaces of the sacrificial patterns 300, the top and bottom surfaces of the insulating patterns 200 exposed by the first recess regions R1, and the side surfaces of the buried insulating patterns 210.

The insulating separation patterns 150 may be formed in the trenches T. The formation of the insulating separation patterns 150 may include forming an insulating layer to fill the trenches T and cover the top surfaces of the layer structures LS and then performing a planarization process on the insulating layer to expose the top surfaces of the layer structures LS. Each of the insulating separation patterns 150 may extend in the second direction Y and may be between the first conductive lines CL1, which are located adjacent to each other in the first direction X. The insulating separation patterns 150 may be formed of or include, e.g., an oxide, a nitride, or an oxynitride.

Figure 8A:
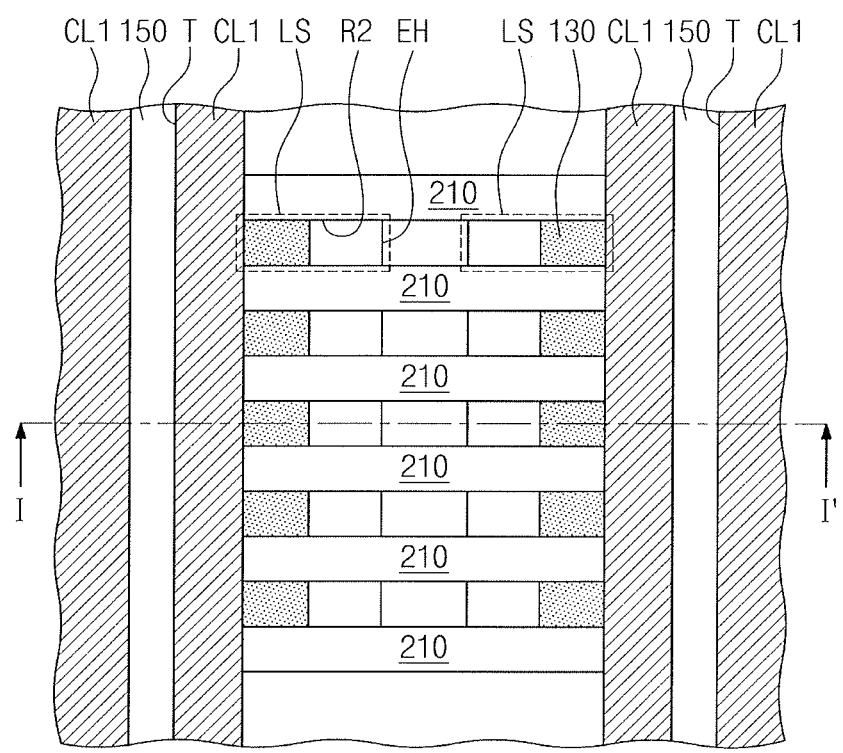
Figure 8B:
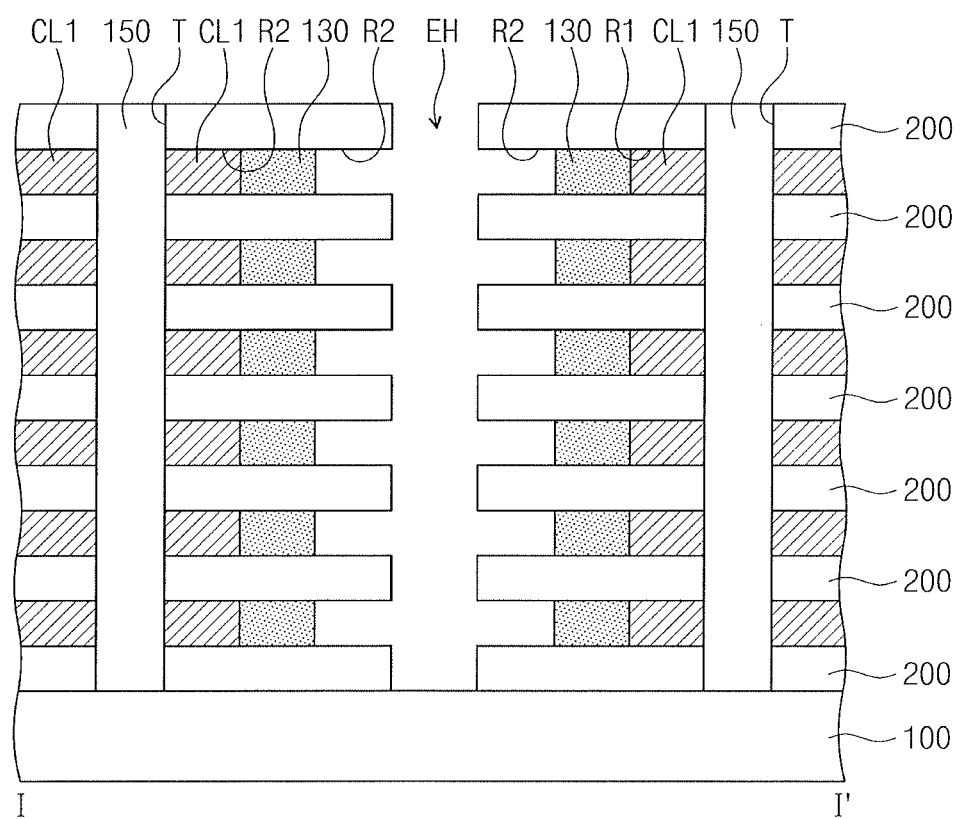

Referring to FIGS. 8A and 8B, electrode holes EH may be formed in the layer structures LS. The formation of the electrode holes EH may include forming a mask pattern on the layer structures LS and the buried insulating patterns 210 and etching the layer structures LS using the mask pattern as an etch mask. For example, the etching process may be performed using an anisotropic etching process. The electrode holes EH may be spaced apart from each other in the second direction Y. Each of the electrode holes EH may be formed between the first conductive lines CL1 that are adjacent to each other in the second direction Y. Each of the electrode holes EH may divide the layer structures LS into two parts, which are separated from each other in the first direction X. For example, the electrode hole EH may divide one layer structure LS between the buried insulating patterns 210 into two layer structures LS, which are separated from each other in the first direction X. The electrode holes EH may expose portions of side surfaces of the buried insulating patterns 210 adjacent to each other in the second direction Y, side surfaces of the layer structures LS separated from each other in the first direction X, and portions of the top surface of the substrate 100.

Portions of the sacrificial patterns 300 exposed by the electrode holes EH may be etched to form second recess regions R2. For example, the second recess regions R2 may be formed by laterally etching the sacrificial patterns 300. The second recess regions R2 may be formed between the insulating patterns 200, which are located adjacent to each other in the third direction Z. The sacrificial patterns 300 may be laterally etched, and the side surfaces of the sacrificial patterns 300 may be inwardly recessed from the side surfaces of the insulating patterns 200 exposed by the electrode holes EH. The second recess regions R2 may be formed, and widths of the sacrificial patterns 300 in the first direction X may be reduced. As a result of the formation of the second recess regions R2, the side surfaces of the sacrificial patterns 300, the top and bottom surfaces of the insulating patterns 200, and the side surfaces of the buried insulating patterns 210 may be at least partially exposed. After the formation of the second recess regions R2, the remaining portions of the sacrificial patterns 300 may serve as the phase-change patterns 130. An electric resistance of the phase-change pattern 130 may be changed depending on its phase or crystal structure, and thus, the phase-change pattern 130 may be used as a memory element. A crystalline structure of the phase-change pattern 130 may be reversibly switched to one of crystalline and amorphous structures depending on its temperature.

Figure 9A:
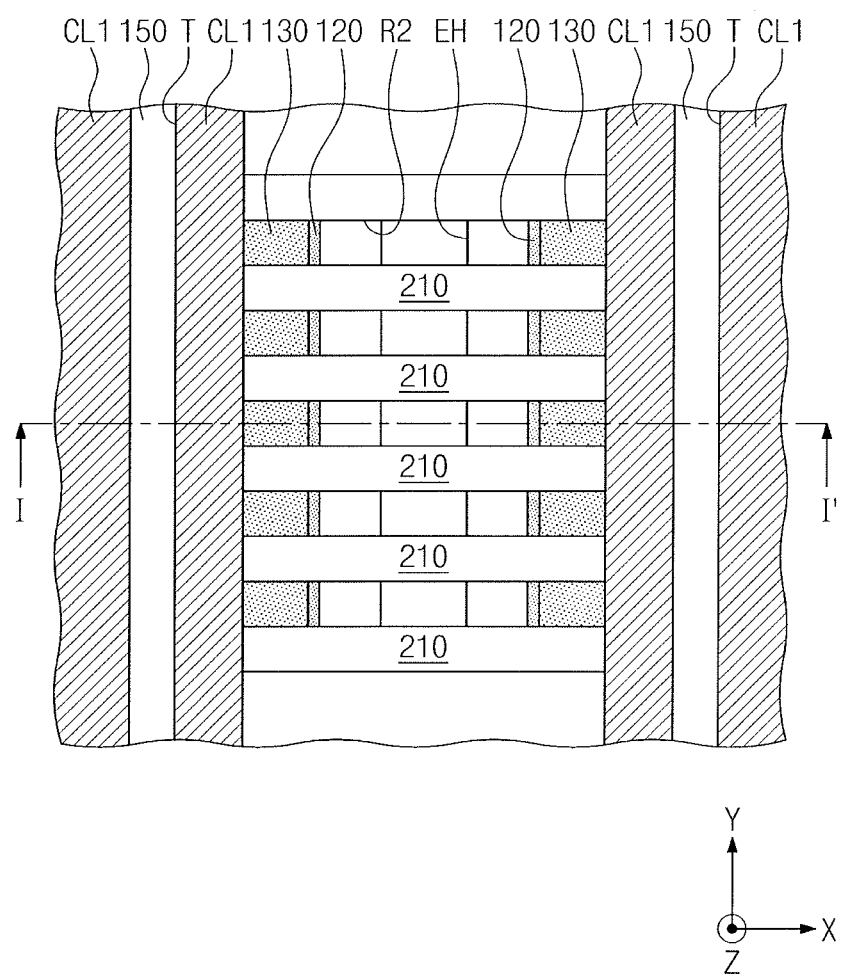
Figure 9B:
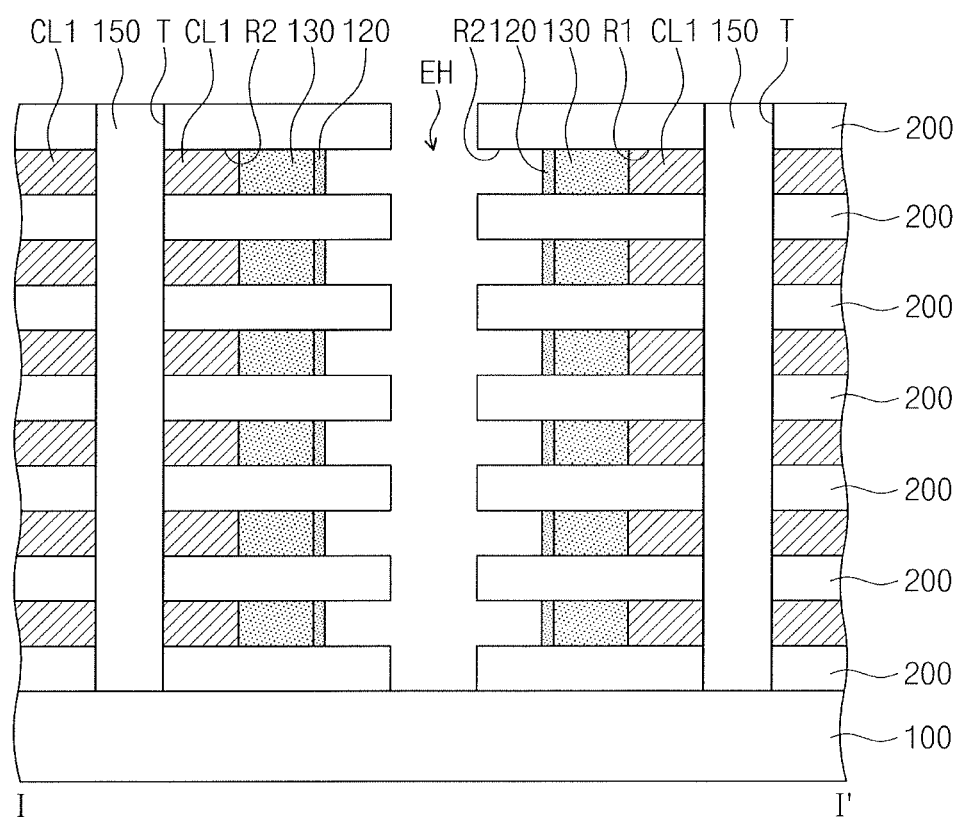

Referring to FIGS. 9A and 9B, the barrier patterns 120 may be formed on side surfaces of the phase-change patterns 130 exposed by the second recess regions R2. The formation of the barrier patterns 120 may include forming a barrier layer to cover the side, top, and bottom surfaces of the insulating patterns 200, the side surfaces of the buried insulating patterns 210, the side surfaces of the phase-change patterns 130, the top surface of the substrate 100, and the top surface of the uppermost insulating layer 200, which are exposed by the electrode holes EH and the second recess regions R2, and performing an etching process. As an example, the etching process may be performed to expose the side, top, and bottom surfaces of the insulating patterns 200, the side surfaces of the buried insulating patterns 210, the top surface of the substrate 100, and the top surface of the uppermost insulating layer 200. In an implementation, the barrier patterns 120 may be locally formed on the side surfaces of the phase-change patterns 130. In an implementation, the etching process may be performed to expose the side surfaces of the insulating patterns 200, the top surface of the substrate 100, and the top surface of the uppermost insulating layer 200. In this case, as shown in FIGS. 3A and 3B, the barrier patterns 120 may be formed to cover or contact, e.g., directly contact, the top and bottom surfaces of the insulating patterns 200, the side surfaces of the buried insulating patterns 210, and the side surfaces of the phase-change patterns 130, which are in the second recess regions R2. For example, the deposition process may be performed using an atomic layer deposition method. In an implementation, a thermal treatment process may be performed after the deposition process. In an implementation, the deposition process and the thermal treatment process may be alternately and repeatedly performed. As a result of the thermal treatment process, the phase-change patterns 130 may become dense. For example, the etching process may be performed using a dry etching process. The barrier patterns 120 may be formed of or include, e.g., carbon, TiN, TiSiN, WSi$_x$, WN, or TiO$_2$.

Referring back to FIGS. 1A and 1B, the selection elements 110 may be formed in the second recess regions R2. The formation of the selection elements 110 may include forming a selection element layer to fill the electrode holes EH and the second recess regions R2 and removing the selection element layer from the electrode holes EH. The selection elements 110 may be formed using one of deposition technologies, which can be performed at a low temperature. For example, the selection elements 110 may be formed using an atomic layer deposition method. A process temperature of the deposition process may range from about 100° C. to about 300° C.

In an implementation, as shown in FIG. 2B, the capping pattern 160 may be formed in the first recess portion RP1 of each of the selection elements 110. A deposition gas, which is used in the deposition process, may include, e.g., SiH$_2$, SiH$_2$I$_2$, or SiI$_4$. In an implementation, the capping pattern 160 may be formed using an atomic layer deposition method.

In an implementation, the selection element 110 may include an Ovonic threshold switching (OTS) material. In an implementation, the selection element 110 may include a chalcogenide switching material containing arsenic (As) and selenium (Se) and may further include an additive element. In an implementation, the additive element may include, e.g., boron (B), carbon (C), nitrogen (N), oxygen (O), phosphorus (P), or sulfur (S). In an implementation, the selection element 110 may include, e.g., GeSe, AsGeSe, GeAsSeTe, GeAsTe, SiAsGeSe, or SiAsGeTe. In an implementation, the selection element 110 may include an oxide diode. In an implementation, the oxide diode may include an n-type oxide layer and a p-type oxide layer. In an implementation, the n-type oxide layer may include, e.g., indium zinc oxide, indium tin oxide, zinc oxide, tin oxide, or titanium oxide. In an implementation, the p-type oxide layer may include, e.g., copper oxide, nickel oxide, copper aluminum oxide, zinc rhodium oxide, or strontium copper oxide. In an implementation, the selection element 110 may include a transition metal oxide. In an implementation, the selection element 110 may include, e.g., NiO, ZnO, TiO, HfO, or TaO.

According to an embodiment, the selection elements 110 may be formed by a low-temperature process, and this may make it possible to reduce lengths of the selection elements 110 in its longitudinal axis direction. Thus, it may be possible to reduce an area of each unit memory cell and consequently to increase an integration density of a variable resistance memory device.

The second conductive lines CL2 may be formed in the electrode holes EH. The second conductive lines CL2 may completely fill the electrode holes EH. The second conductive lines CL2 may be formed of or include, e.g., a metal (such as copper, tungsten, or aluminum) or a metal nitride (such as tantalum nitride, titanium nitride, or tungsten nitride).

By way of summation and review, in the case of a two-dimensional or planar semiconductor device, their integration may be mainly determined by the area occupied by a unit memory cell, and integration may be greatly influenced by the level of a fine pattern forming technology. Extremely expensive process equipment may be used to increase pattern fineness and may set a practical limitation on increasing integration for two-dimensional or planar semiconductor devices. Three-dimensional semiconductor memory devices including three-dimensionally arranged memory cells have recently been considered. In addition, next-generation semiconductor memory devices, such as a magnetic random access memory (MRAM) and a phase-change random access memory (PRAM), are being developed in order to meet an increasing demand for a semiconductor memory device with high performance and low power consumption properties.

According to an embodiment, selection elements may be formed by a low-temperature process, and this may make it possible to reduce lengths of the selection elements in its longitudinal axis direction. Thus, it may be possible to reduce an area of each unit memory cell and consequently to increase an integration density of a variable resistance memory device.

One or more embodiments may provide a vertical-stack-type variable resistance memory device.

One or more embodiments may provide a variable resistance memory device with an increased integration density.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A variable resistance memory device, comprising:
insulating patterns sequentially stacked on a substrate;
first conductive lines between adjacent ones of the insulating patterns and spaced apart from each other in a first direction;
a second conductive line between the first conductive lines and penetrating the insulating patterns in a third direction perpendicular to a top surface of the substrate;
a phase-change pattern between the second conductive line and each of the first conductive lines and between the adjacent ones of the insulating patterns to cover a top surface of a first adjacent insulating pattern and a bottom surface of a second adjacent insulating pattern; and
a selection element between the phase-change pattern and the second conductive line and between the adjacent ones of the insulating patterns to cover the top surface of the first adjacent insulating pattern and the bottom surface of the second adjacent insulating pattern.

2. The device as claimed in claim 1, wherein:
the selection element includes a chalcogenide material, and
the chalcogenide material includes GeSe, AsGeSe, GeAsSeTe, GeAsTe, SiAsGeSe, or SiAsGeTe.

3. The device as claimed in claim 1, wherein:
the selection element includes an oxide diode including an n-type oxide layer and a p-type oxide layer,
the n-type oxide layer includes indium zinc oxide, indium tin oxide, zinc oxide, tin oxide, or titanium oxide, and
the p-type oxide layer includes copper oxide, nickel oxide, copper aluminum oxide, zinc rhodium oxide, or strontium copper oxide.

4. The device as claimed in claim 1, wherein:
the selection element includes a transition metal oxide, and
the transition metal oxide includes NiO, ZnO, TiO, HfO, or TaO.

5. The device as claimed in claim 1, further comprising a barrier pattern between the phase-change pattern and the selection element and covering the top surface of the first adjacent insulating pattern and the bottom surface of the second adjacent insulating pattern,
wherein the barrier pattern includes carbon, $TiO_2$, TiN, TiSiN, $WSi_x$, or WN.

6. The device as claimed in claim 1, further comprising buried insulating patterns on the substrate and at both sides of the insulating patterns,
wherein:
the buried insulating patterns have a longitudinal axis parallel to the first direction and are spaced apart from each other in a second direction crossing the first direction,
the second conductive line, the phase-change pattern, and the selection element are between adjacent buried insulating patterns, and
the first conductive lines are on side surfaces of the buried insulating patterns and extend lengthwise in the second direction.

7. The device as claimed in claim 1, further comprising a barrier pattern between the phase-change pattern and the selection element and covering the top surface of the first adjacent insulating pattern and the bottom surface of the second adjacent insulating pattern,
wherein:
the adjacent ones of the insulating patterns include an upper insulating pattern and a lower insulating pattern, which are adjacent to each other in the third direction, and
the barrier pattern includes:
a first portion between the phase-change pattern and the selection element;
a second portion between the upper insulating pattern and a top surface of the selection element; and
a third portion between the lower insulating pattern and a bottom surface of the selection element, and
the first portion and the second portion are parallel to each other.

8. The device as claimed in claim 7, wherein:
the selection element is in the barrier pattern,
the selection element has a first recess portion recessed inwardly from a side surface of the selection element that is adjacent to the second conductive line, and
the variable resistance memory device further includes a capping pattern in the first recess portion.

9. The device as claimed in claim 1, wherein:
the selection element includes:
a first portion between the phase-change pattern and the second conductive line;
a second portion extending from a first end of the first portion; and
a third portion extending from a second end of the first portion, and the second portion and the third portion are parallel to each other.

10. A variable resistance memory device, comprising:
insulating patterns sequentially stacked on a substrate in a third direction perpendicular to a top surface of the substrate;

first conductive lines between adjacent ones of the insulating patterns in the third direction and spaced apart from each other in a first direction;
a second conductive line between the first conductive lines and penetrating the insulating patterns in the third direction;
a selection element between the second conductive line and each of the first conductive lines and between the adjacent ones of the insulating patterns, the selection element having a first recess portion recessed inwardly from a side surface thereof; and
a capping pattern in the first recess portion.

11. The device as claimed in claim 10, wherein the selection element includes a chalcogenide material, an oxide diode, or a transition metal oxide.

12. The device as claimed in claim 10, further comprising:
a phase-change pattern between the selection element and each of the first conductive lines and between the adjacent ones of the insulating patterns; and
a barrier pattern between the phase-change pattern and the selection element,
wherein the side surface of the selection element is adjacent to the second conductive line.

13. The device as claimed in claim 10, further comprising:
a phase-change pattern between the selection element and the second conductive line and between the adjacent ones of the insulating patterns; and
a barrier pattern between the selection element and the phase-change pattern,
wherein the side surface of the selection element is adjacent to the second conductive line.

14. The device as claimed in claim 10, further comprising a barrier pattern between each of the second conductive lines and the selection element,
wherein:
the barrier pattern has a second recess portion recessed from a side surface of the barrier pattern that is adjacent to the selection element, and
the selection element is in the second recess portion.

15. The device as claimed in claim 10, further comprising buried insulating patterns on the substrate and at both sides of the insulating patterns, the buried insulating patterns being spaced apart from each other in a second direction crossing the first direction,
wherein the selection element is between the buried insulating patterns and covers side surfaces of the buried insulating patterns that are parallel to the first direction.

16. A variable resistance memory device, comprising:
first conductive lines stacked in a third direction perpendicular to a top surface of a substrate and extending lengthwise in a first direction;
at least one second conductive line at one side of the first conductive lines and extending lengthwise in the third direction; and
a memory cell including a phase-change pattern and a selection element between each of the first conductive lines and the at least one second conductive line, the selection element directly contacting the at least one second conductive line,
wherein the selection element includes an oxide diode or a transition metal oxide.

17. The device as claimed in claim 16, wherein:
the oxide diode includes an n-type oxide layer and a p-type oxide layer,
the n-type oxide layer includes indium zinc oxide, indium tin oxide, zinc oxide, tin oxide, or titanium oxide, and
the p-type oxide layer includes copper oxide, nickel oxide, copper aluminum oxide, zinc rhodium oxide, or strontium copper oxide.

18. The device as claimed in claim 16, wherein the transition metal oxide includes NiO, ZnO, TiO, HfO, or TaO.

19. The device as claimed in claim 16, wherein:
the memory cell further includes a barrier pattern between the selection element and the phase-change pattern, and
the barrier pattern includes carbon, $TiO_2$, TiN, TiSiN, $WSi_x$, or WN.

20. The device as claimed in claim 16, wherein:
the at least one second conductive line includes a plurality of second conductive lines, and
the plurality of second conductive lines are spaced apart from each other in a second direction on the top surface of the substrate, the second direction crossing the first direction and the third direction.

* * * * *